US007480154B2

(12) United States Patent
Lawrence et al.

(10) Patent No.: US 7,480,154 B2
(45) Date of Patent: Jan. 20, 2009

(54) METHOD AND APPARATUS FOR SECURING A CABLE MANAGEMENT SYSTEM

(75) Inventors: Bradley Michael Lawrence, Austin, TX (US); Allison McGrew, Cedar Park, TX (US); Robert Nerhood, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 591 days.

(21) Appl. No.: 11/204,628

(22) Filed: Aug. 16, 2005

(65) Prior Publication Data
US 2007/0039902 A1    Feb. 22, 2007

(51) Int. Cl.
*H02B 1/36* (2006.01)
(52) U.S. Cl. ............... 361/826; 211/26; 174/72 A; 248/828.1
(58) Field of Classification Search ............... 361/826, 361/825, 827; 174/72 A, 69; 211/26; 248/282.1
See application file for complete search history.

(56) References Cited

U.S. PATENT DOCUMENTS

| | | | | |
|---|---|---|---|---|
| 5,571,256 | A * | 11/1996 | Good et al. | 211/26 |
| 6,070,742 | A * | 6/2000 | McAnally et al. | 211/26 |
| 6,305,556 | B1 | 10/2001 | Mayer | |
| 6,435,354 | B1 * | 8/2002 | Gray et al. | 211/26 |
| 6,600,665 | B2 * | 7/2003 | Lauchner | 361/826 |
| 6,747,874 | B2 * | 6/2004 | McKinnon et al. | 361/724 |
| 6,902,069 | B2 * | 6/2005 | Hartman et al. | 211/26 |
| 6,945,504 | B2 * | 9/2005 | Chen et al. | 248/282.1 |
| 6,972,949 | B1 * | 12/2005 | Helgenberg et al. | 361/683 |
| 7,008,112 | B2 * | 3/2006 | Yamashita et al. | 384/119 |
| 7,023,708 | B2 * | 4/2006 | Nguyen et al. | 361/810 |
| 7,317,623 | B2 * | 1/2008 | Nguyen et al. | 361/826 |
| 7,359,218 | B2 * | 4/2008 | McGrew | 361/826 |
| 2005/0145582 | A1 * | 7/2005 | Dubon et al. | 211/26 |

\* cited by examiner

*Primary Examiner*—Jeremy C Norris
*Assistant Examiner*—Demaon E. Levi
(74) *Attorney, Agent, or Firm*—Haynes and Boone, LLP

(57) ABSTRACT

A cable management system securing apparatus includes a rack mount. A cable management system securing arm is pivotally coupled to the rack mount and operable to be pivoted and locked in a securing position and a release position. The rack mount may be mounted to an information handling system rack and the cable management system securing arm may be pivoted and locked in the securing position in order to secure a cable management system in the information handling system rack.

24 Claims, 14 Drawing Sheets

METHOD AND APPARATUS FOR SECURING A CABLE MANAGEMENT SYSTEM

BACKGROUND

The present disclosure relates generally to information handling systems, and more particularly to securing a cable management system used with an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, rack mounted servers, are mounted in racks to facilitate storage, use, and access to the information handling systems. Cable management systems are typically mounted to the racks in order to manage the numerous cables which are coupled to the information handling systems. Some of these cable management systems are pivotally mounted to the racks and the information handling systems in order to allow the information handling systems to be cycled in and out of the rack while the cables remain in the cable management systems. A number of issues arise with respect to these cable management systems.

When the information handling systems are in the rack with the cables coupled to the information handling system and positioned in the cable management system, the information handling system may be pushed fully into the rack for storage or use. When the information handling system is pushed fully into the rack, the tension in the cables can cause the cable management systems to pivot away from the information handling system and towards the back of the rack such that, when a user attempts to access the information handling system from the back of the rack, they must deal with one or more cable management systems which are pivoted towards them, or which come swinging out at them when the door to the back of the rack is opened.

Conventional methods used to secure these cable management systems tend to take up too much space and are difficult to install and use.

Accordingly, it would be desirable to provide for securing a cable management system absent the disadvantages found in the prior methods discussed above.

SUMMARY

According to one embodiment, a cable management system securing apparatus is provided which includes a rack mount and a cable management system securing arm pivotally coupled to the rack mount and operable to be pivoted and locked in a securing position and a release position.

BRIEF DESCRIPTION OF THE DRAWINGS

FIG. 4b is a rear view illustrating an embodiment of the information handling system rack of FIG. 4a.

FIG. 5 is a perspective view illustrating an embodiment of an information handling system used with the cable management system securing arm of FIG. 2, the rack mount of FIG. 3, and the information handling system rack of FIG. 4a.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
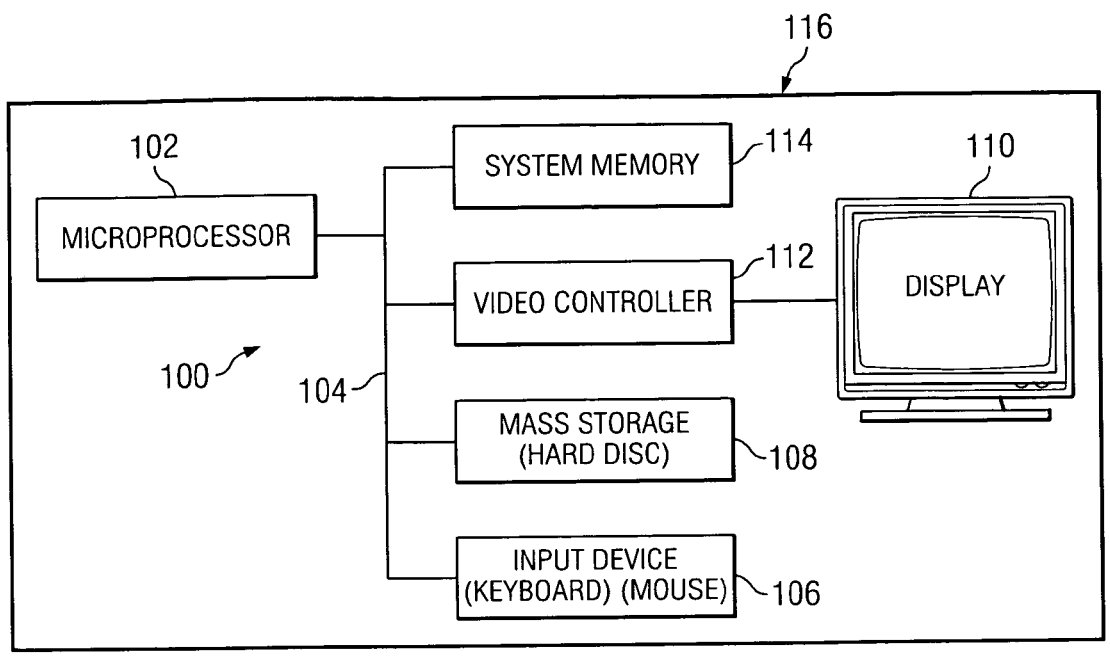
FIG. 1 is a schematic view illustrating an embodiment of an information handling system.

In one embodiment, information handling system 100, FIG. 1, includes a microprocessor 102, which is connected to a bus 104. Bus 104 serves as a connection between microprocessor 102 and other components of computer system 100. An input device 106 is coupled to microprocessor 102 to provide input to microprocessor 102. Examples of input devices include keyboards, touchscreens, and pointing devices such as mouses, trackballs and trackpads. Programs and data are stored on a mass storage device 108, which is coupled to microprocessor 102. Mass storage devices include such devices as hard disks, optical disks, magneto-optical drives, floppy drives and the like. Information handling system 100 further includes a display 110, which is coupled to microprocessor 102 by a video controller 112. A system memory 114 is coupled to microprocessor 102 to provide the microprocessor with fast storage to facilitate execution of computer programs by microprocessor 102. In an embodiment, a chassis 116 houses some or all of the components of information handling system 100. It should be understood that other buses and intermediate circuits can be deployed between the components described above and microprocessor 102 to facilitate interconnection between the components and the microprocessor.

Figure 2:
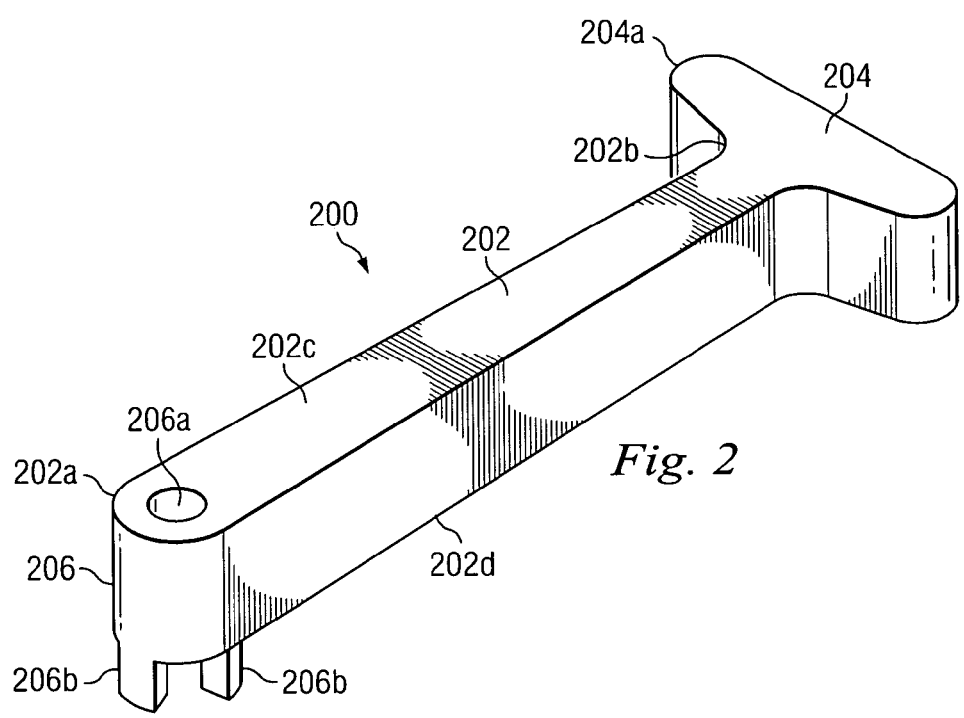
FIG. 2 is a perspective view illustrating an embodiment of a cable management system securing arm.

Referring now to FIG. 2, a cable management system securing arm 200 is illustrated. The securing arm 200 includes an elongated body 202 having a distal end 202a, a distal end 202b that is located opposite the distal end 202a, a top surface 202c extending between the distal ends 202a and 202b, and a bottom surface 202d which is located opposite the top surface 202c and which also extends between the distal ends 202a and 202b. A cable management system engaging member 204 extends from the distal end 202b of the elongated body 202 and, in an embodiment, forms a T-shaped handle with the elongated body 202 that includes a system engagement surface 204a. A mount coupler 206 is included on the distal end 202a of the elongated body 202 and located opposite the cable management system engaging member 204. The mount coupler 206 defines a pivotal coupling aperture 206a extending through the elongated body 202 from the top surface 202c to the bottom surface 202d and includes a plurality of securing teeth 206b which extend from the bottom surface 202d in a circumferentially spaced apart relationship adjacent the distal end 202a of the elongated member 202.

Figure 3:
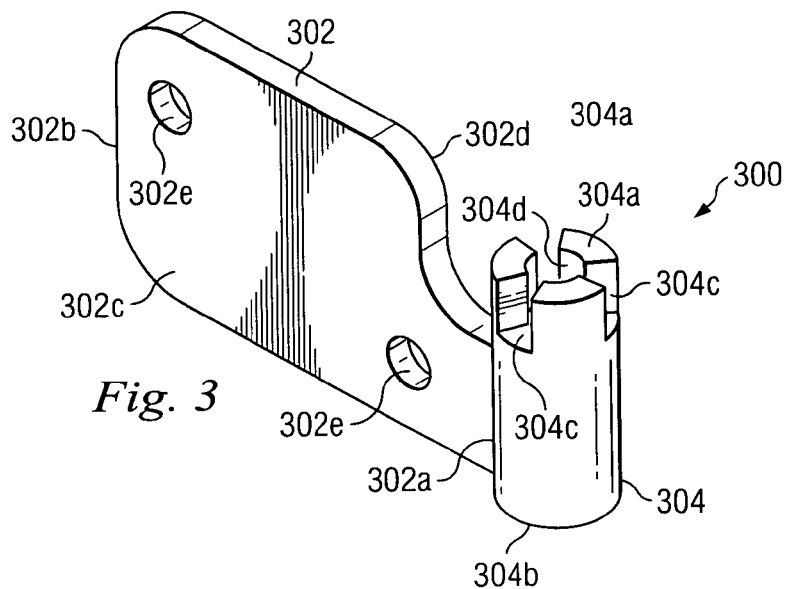
FIG. 3 is a perspective view illustrating an embodiment of a rack mount used with the cable management system securing arm of FIG. 2.

Referring now to FIG. 3, a rack mount 300 is illustrated. The rack mount 300 includes a base 302 having a front edge 302a, a rear edge 302b located opposite the front edge 302a, a pair of opposing side surfaces 302c and 302d extending between the front edge 302a and the rear edge 302b, and defining a plurality of mounting apertures 302e extending through the base 302 from the side surface 302c to the side surface 302d. An arm coupler 304 extends from the front edge 302a of the base 302 and, in an embodiment, includes a cylindrical member having a distal end 304a and a distal end 304b located opposite the distal end 304a. A plurality of arm securing channels 304c are defined by the arm coupler 304 and located in a circumferentially spaced apart relationship about the distal end 304a. A pivotal coupling aperture 304d is defined by the arm coupler 304 and is centrally located between the plurality of arm securing channels 304c.

Referring now to FIGS. 4a, 4b, 4c, and 4d, an information handling system rack 400 is illustrated. The information handling system rack 400 includes a base 402 having a plurality of support beams 404a, 404b, 404c, and 404d extending from the base 402 and located in a spaced apart relationship at each corner of the base 402. The support beams 404a, 404b, 404c, and 404d extend between the base 402 and a top (not shown) which has been omitted for clarity. A coupling beam 404e extends from the base 402 and is located adjacent the support beam 404a. A coupling beam 404f extends from the base 402 and is located adjacent the support beam 404b. The coupling beam 404f includes a plurality of cable management system couplers 404fa and 404fb extending from the coupling beam 404f in a spaced apart relationship along its length.

An information handling system support 406a extends between the support beams 404a and 404d and defines a coupling channel 406aa. An information handling system support 406b extends between the support beams 404b and 404c, is substantially coplanar with the information handling system support 406a, and defines a coupling channel 406ba. An information handling system support 408a extends between the support beams 404a and 404d, is located substantially parallel to and spaced apart from the information handling system support 406a, and defines a coupling channel 408aa. An information handling system support 408b extends between the support beams 404b and 404c, is located substantially parallel to and spaced apart from the information handling system support 406b on the opposite side of the cable management system coupler 404fa as information handling system support 406b, is substantially coplanar with the information handling system support 408a, and defines a coupling channel 408ba. An information handling system support 410a extends between the support beams 404a and 404d, is located substantially parallel to and spaced apart from the information handling system support 408a, and defines a coupling channel 410aa. An information handling system support 410b extends between the support beams 404b and 404c, is located substantially parallel to and spaced apart from the information handling system support 408b on the opposite side of the cable management system coupler 404fb as information handling system support 408b, is substantially coplanar with the information handling system support 410a, and defines a coupling channel 410ba.

Figure 4A:
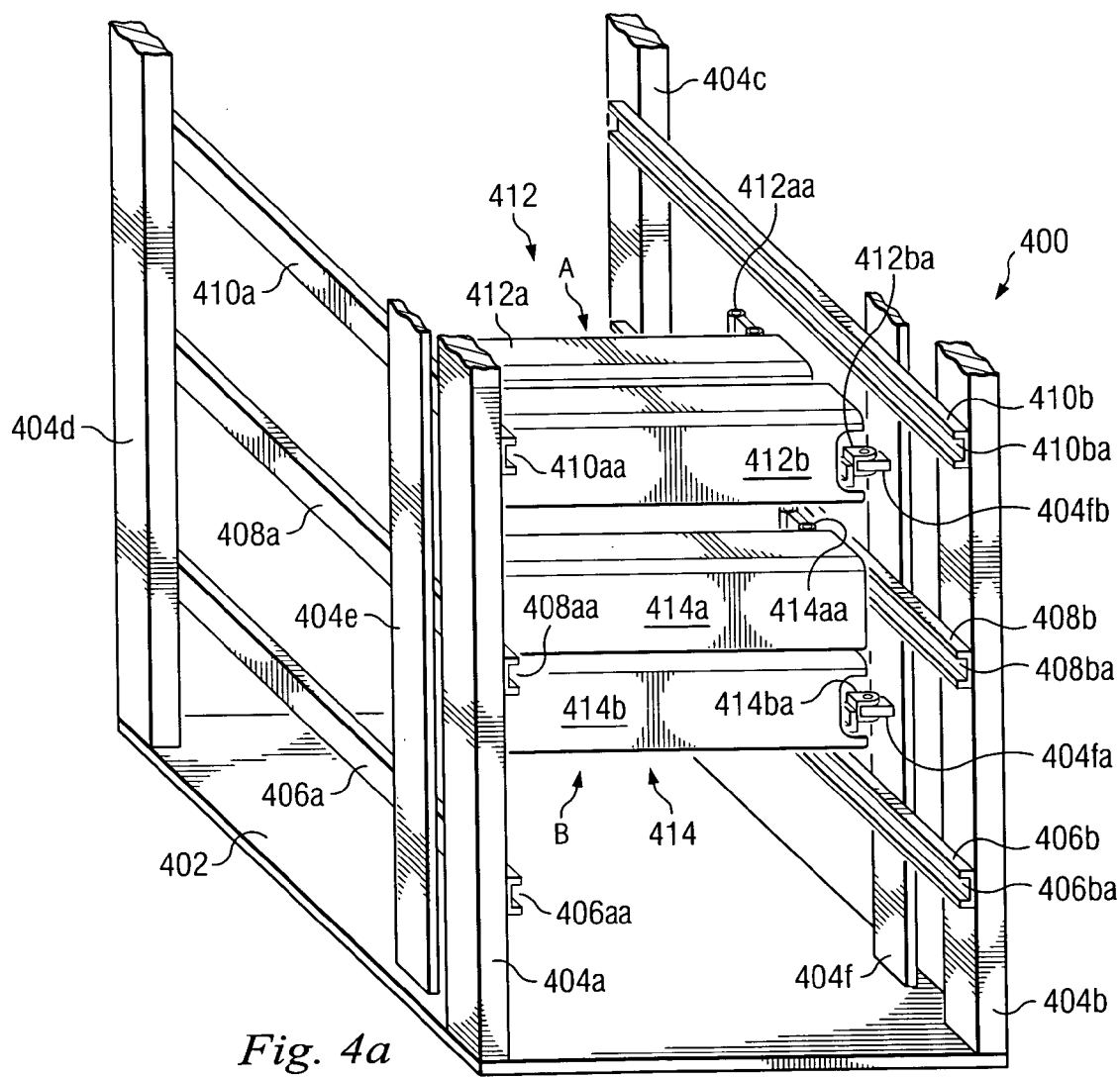
FIG. 4a is a perspective view illustrating an embodiment of an information handling system rack used with the cable management system securing arm of FIG. 2 and the rack mount of FIG. 3.
Figure 4B:
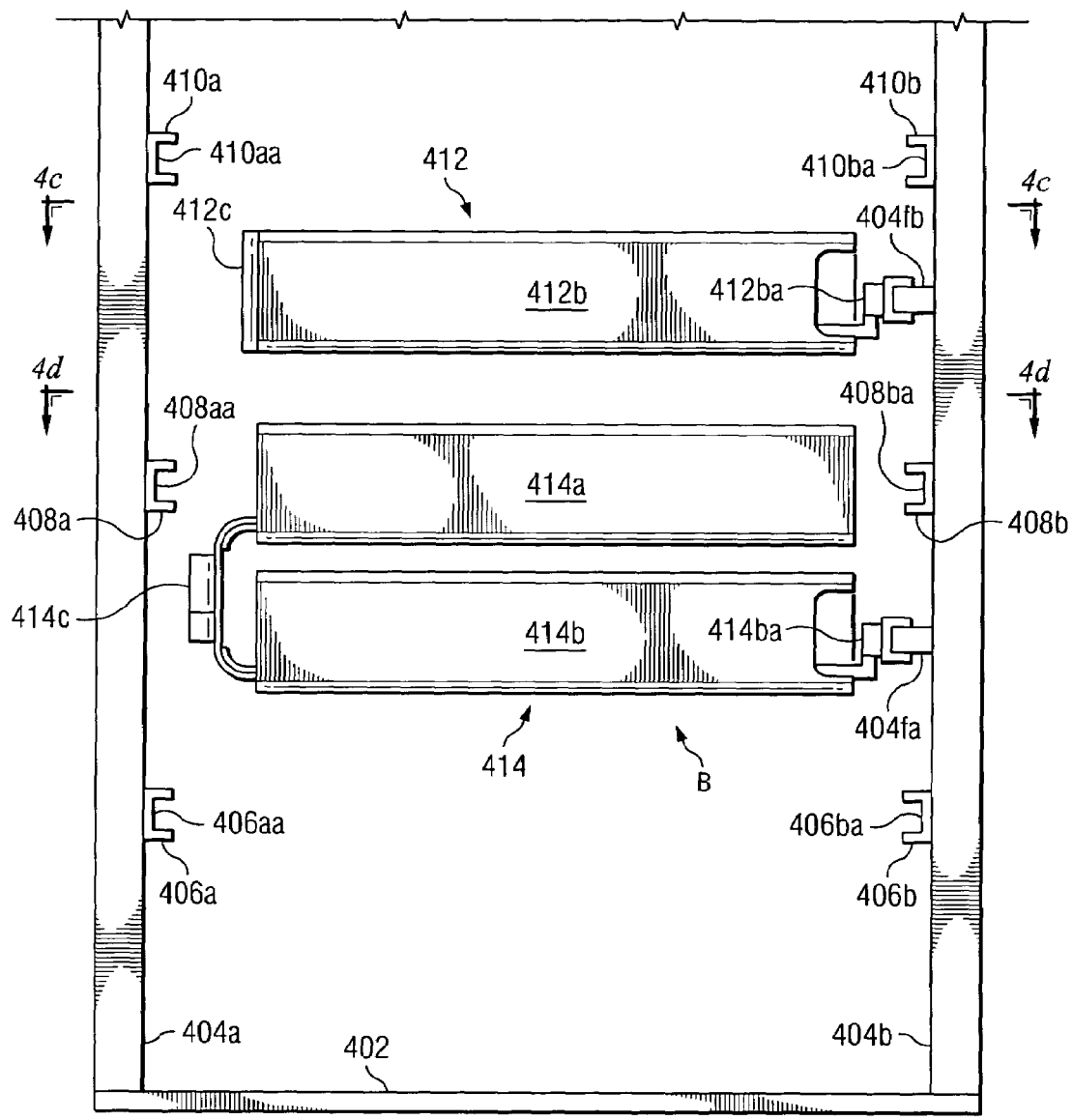
Figure 4C:
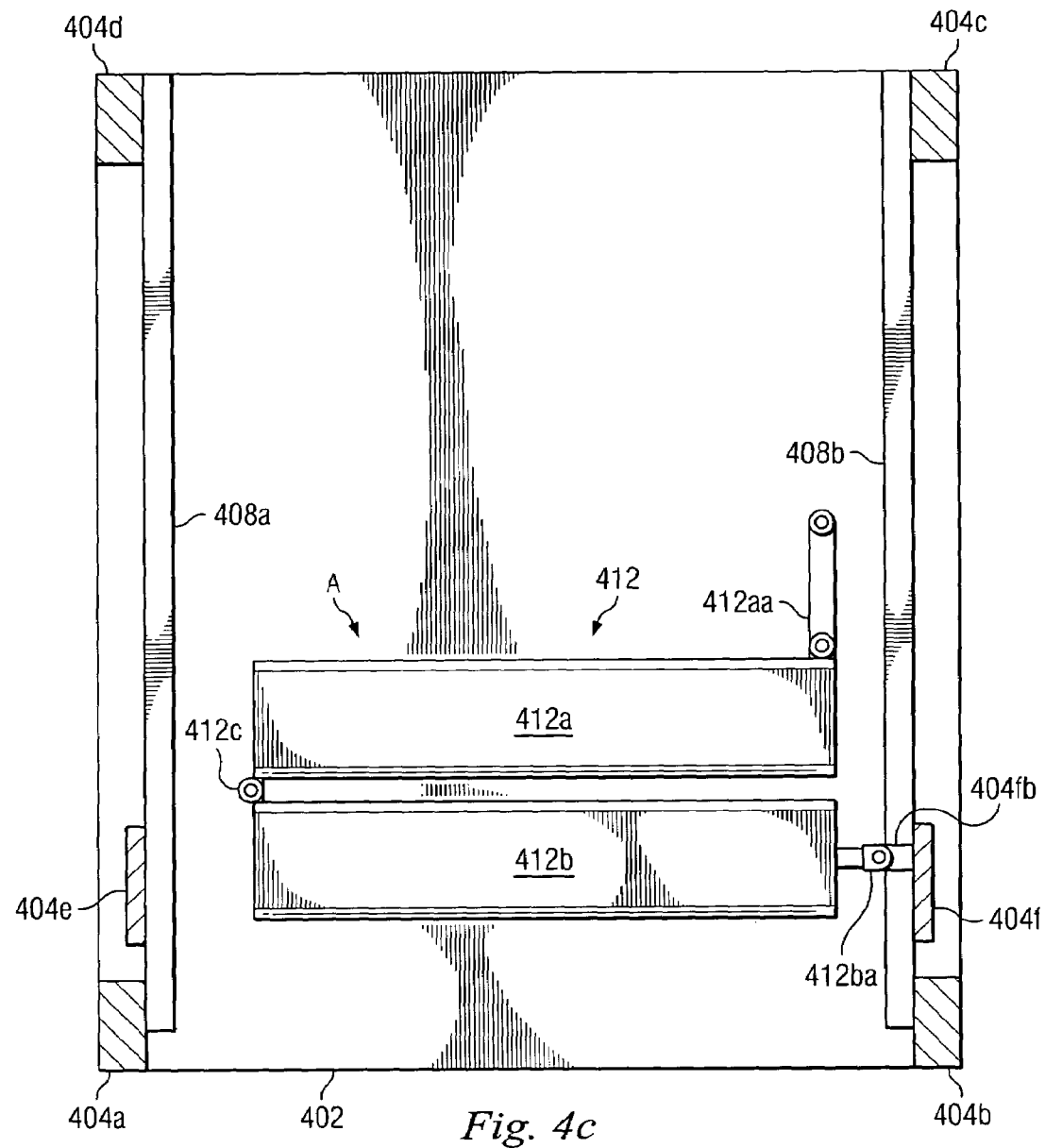
FIG. 4c is a cross sectional view illustrating an embodiment of the information handling system rack of FIG. 4b.
Figure 4D:
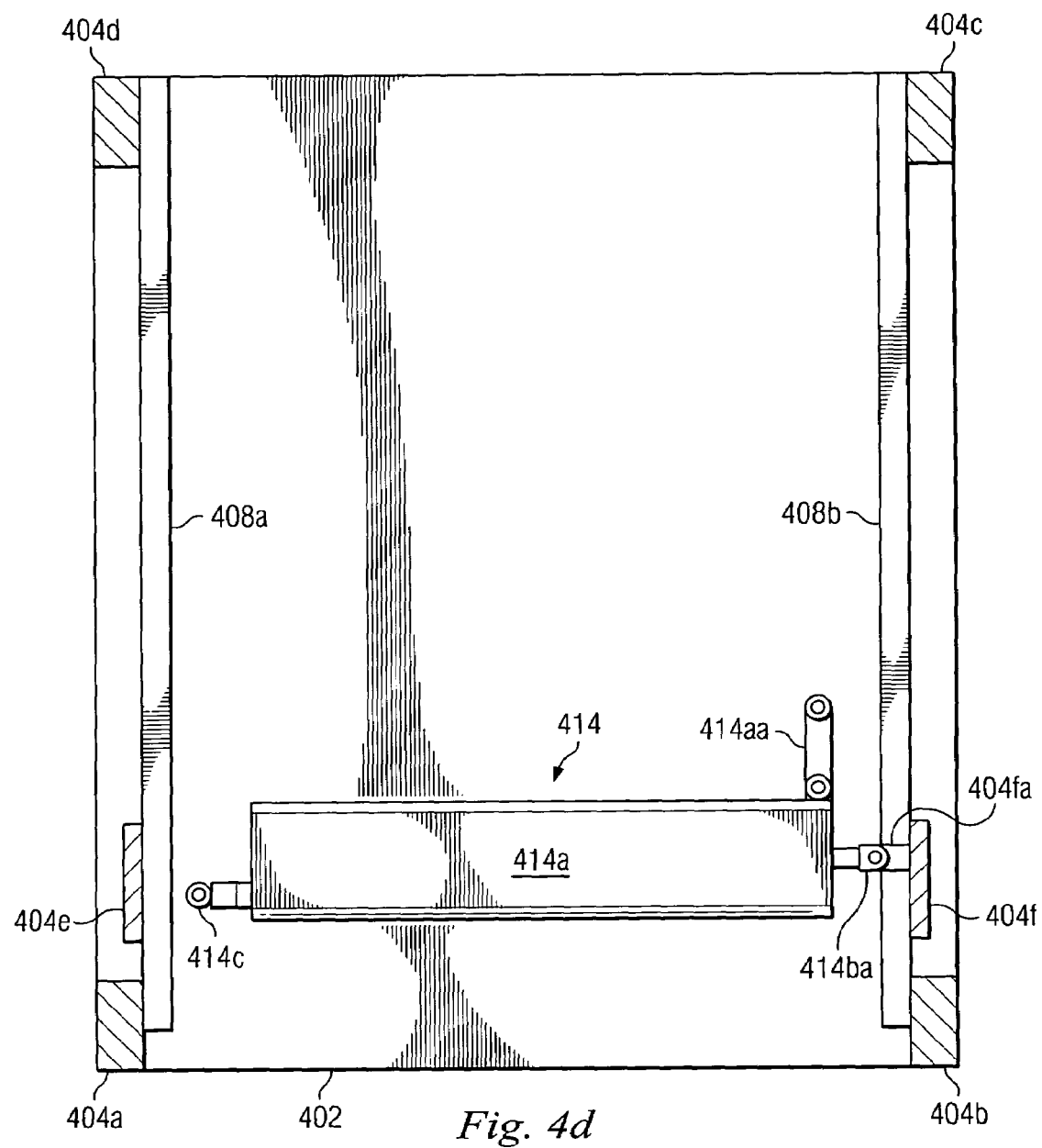
FIG. 4d is a cross sectional view illustrating an embodiment of the information handling system rack of FIG. 4b.

A horizontally stacked cable management system 412 is included in the information handling system rack 400 which has a cable management member 412a which is pivotally coupled to a cable management member 412b by a hinge 412c, such that the cable management members 412a and 412*b* may be pivoted about the hinge with respect to each other until they are positioned side by side in a horizontally stacked orientation A, illustrated in FIGS. 4*a* and 4*c*. A rack pivotal coupling 412*ba* extends from a distal end of the cable management member 412*b* and is pivotally coupled to the cable management system coupler 404*fb* on coupling beam 404*f*. In an embodiment, the horizontally stacked cable management system 412 may be pivotally coupled to the information handling system rack 400 in a variety of different ways such as, for example, by pivotally coupling the rack pivotal coupling 412*ba* to a bracket which is mounted to the information handling system support 410*b*. A information handling system pivotal coupling 412*aa* extends from a distal end of the cable management member 412*a*.

A vertically stacked second cable management system 414 is included in the information handling system rack 400 which has a cable management member 414*a* which is pivotally coupled to a cable management member 414*b* by a hinge 414*c*, such that the cable management members 414*a* and 414*b* may be pivoted about the hinge with respect to each other until the cable management member 414*a* is positioned on top of the cable management member 414*b* in a vertically stacked orientation B, illustrated in FIGS. 4*a* and 4*b*. A rack pivotal coupling 414*ba* extends from a distal end of the cable management member 414*b* and is pivotally coupled to the cable management system coupler 404*fa* on coupling beam 404*f*. In an embodiment, the vertically stacked cable management system 414 may be pivotally coupled to the information handling system rack 400 in a variety of different ways such as, for example, by pivotally coupling the rack pivotal coupling 412*ba* to a bracket which is mounted to the information handling system support 406*b*. A information handling system pivotal coupling 414*aa* extends from a distal end of the cable management member 414*a*. In an embodiment, a variety of conventional cable management systems may be used in addition to, or in place of, the cable management systems 412 and 414.

Figure 5:
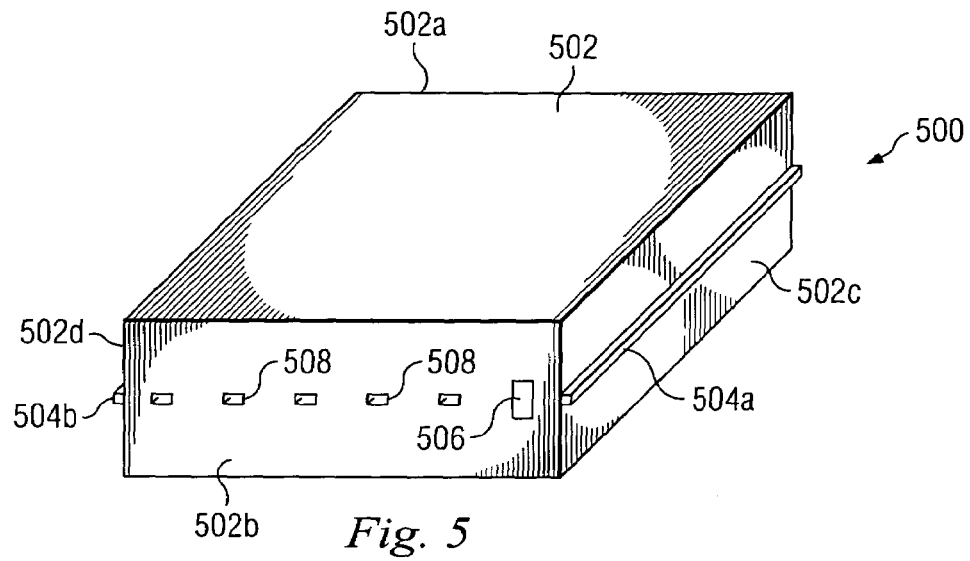

Referring now to FIG. 5, an information handling system 500 is illustrated. In an embodiment, the information handling system 500 may be the information handling system 100, described above with reference to FIG. 1. The information handling system 500 includes a chassis 502 having a front surface 502*a*, a rear surface 502*b* located opposite the front surface 502*a*, and a plurality of side surfaces 502*c* and 502*d* extending between the front surface 502 and the rear surface 502*b*. In an embodiment, the chassis 502 may be the chassis 116, described above with reference to FIG. 1, and may house some or all of the component of information handling system 100, described above with reference to FIG. 1. A rack coupling member 504*a* extends from the side surface 502*c* of the chassis 502 and along the length of the chassis 502 from the front surface 502*a* to the rear surface 502*b*. A rack coupling member 504*b* extends from the side surface 502*d* of the chassis 502 and along the length of the chassis 502 from the front surface 502*a* to the rear surface 502*b*. A cable management system coupling surface 506 is located on the rear surface 502*b* of the chassis 502 and adjacent the side surface 502*c*. A plurality of cable couplers 508 are located in a spaced apart relationship along the rear surface 502*b* of the chassis 502.

Figure 6A:
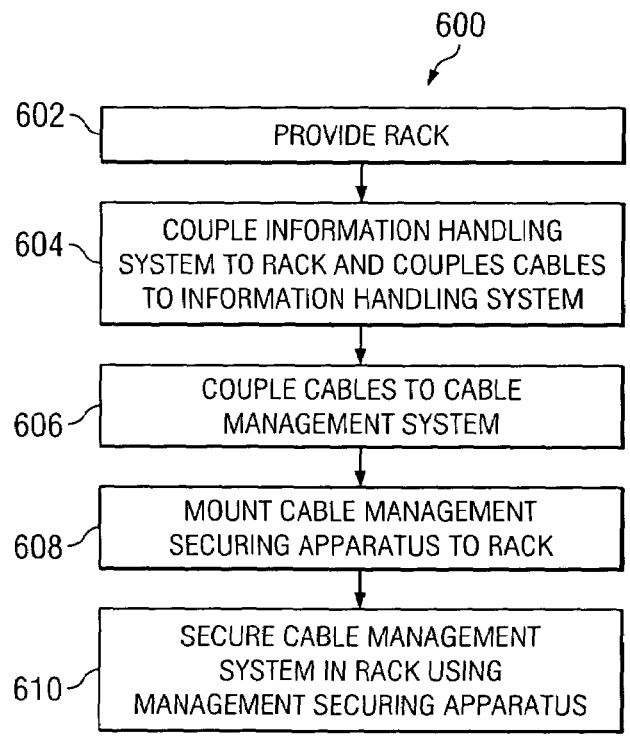
FIG. 6a is a flow chart illustrating an embodiment of a method for securing a cable management system.
Figure 6B:
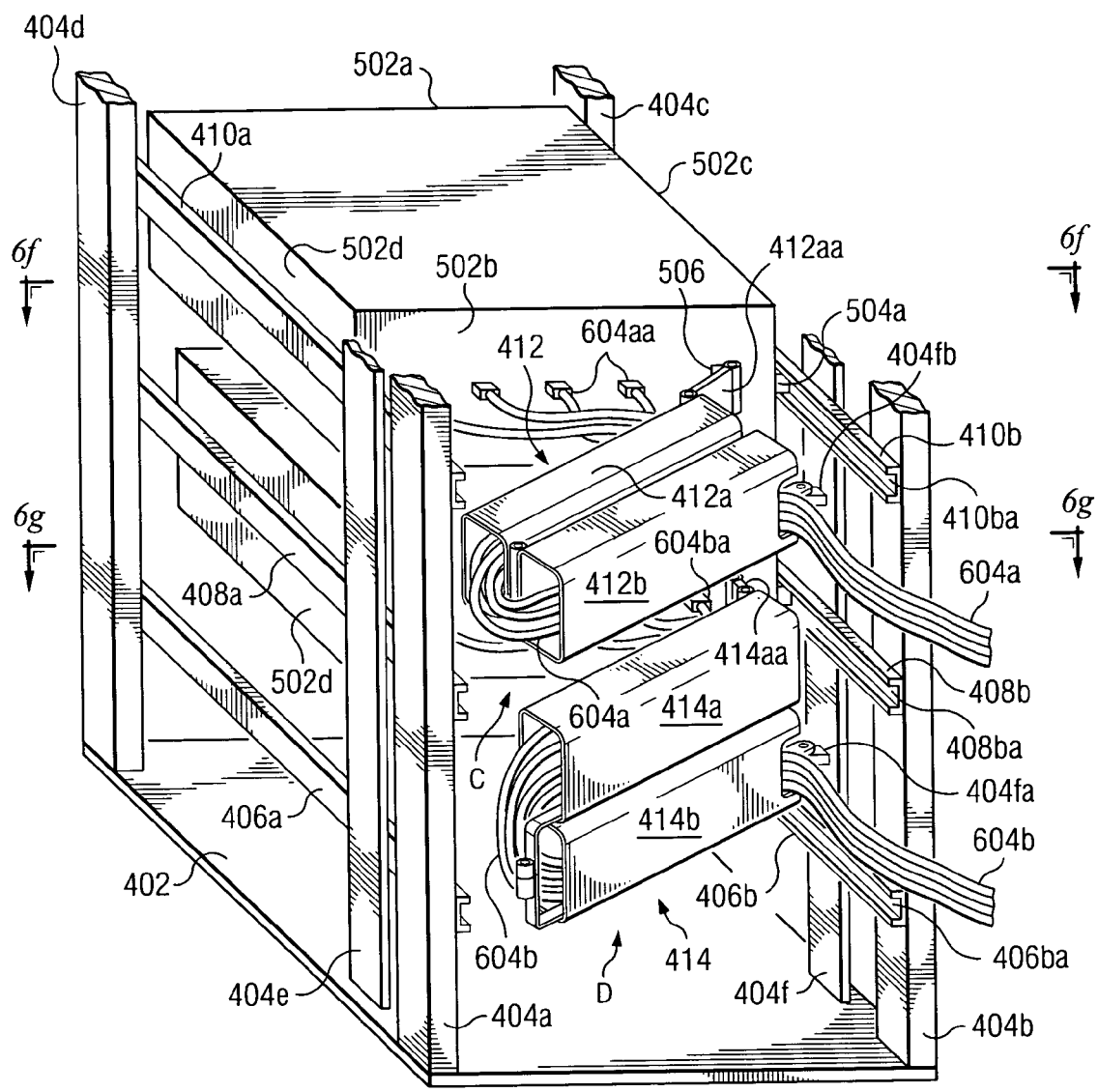
FIG. 6b is a perspective view illustrating an embodiment of the information handling system rack of FIG. 4a with the information handling system of FIG. 5 coupled to the information handling system rack and a plurality of cables coupled to the cable management systems and the information handling system.

Referring now to FIGS. 4*a*, 5, 6*a*, and 6*b*, a method 600 for securing a cable management system is illustrated. The method 600 begins at step 602 where the information handling system rack 400, described above with reference to FIGS. 4*a*, 4*b*, 4*c*, and 4*d*, is provided. The method 600 then proceeds to step 604 where the information handling system 500 is coupled to the information handling system rack 400 and a plurality of cables are coupled to the information handling system 500. An information handling system 500 is coupled to the information handling system rack 400 by positioning the rack coupling members 504*a* and 504*b* in the coupling channels 410*ba* and 410*aa*, respectively, on the information handling system supports 410*b* and 410*a*, respectively. An information handling system 500 is also coupled to the information handling system rack 400 by positioning the rack coupling members 504*a* and 504*b* in the coupling channels 408*ba* and 408*aa*, respectively, on the information handling system supports 408*b* and 408*a*, respectively. In an embodiment, the information handling systems 500 may includes a variety of different hardware in place of the rack coupling members 504*a* and 504*b* for coupling the information handling systems 500 to the information handling system rack 400. A plurality of cables 604*a* each including an information handling system coupler 604*aa* on its distal end are coupled to the information handling system 500 by coupling the information handling system couplers 604*aa* to the cable couplers 508 on the rear surface 502*b* of information handling system 500, as illustrated in FIG. 6*b*. A plurality of cables 604*b* each including an information handling system coupler 604*ba* on its distal end are coupled to the information handling system 500 by coupling the information handling system couplers 604*ba* to the cable couplers 508 on the rear surface 502*b* of information handling system 500, as illustrated in FIG. 6*b*.

Referring now to FIGS. 5, 6*a*, 6*b*, the method 600 proceeds to step 606 where the plurality of cables 604*a* and 604*b* are coupled to the cable management system. The plurality of cables 604*a* are coupled to the cable management system 412, and a plurality of cables 604*b* are coupled to the cable management system 414, as illustrated in FIG. 6*b*. The information handling system pivotal coupling 412*aa* on cable management system 412 is then coupled to the cable management system coupling surface 506 using conventional methods known in the art such as, for example, with a bracket, and the information handling system pivotal coupling 414*aa* on cable management system 414 is then coupled to the cable management system coupling surface 506 using conventional methods known in the art such as, for example, with a bracket. In an embodiment, the information handling system pivotal couplings 412*aa* and 414*aa* on the cable management systems 412 and 414, respectively, may be coupled to translating members on the information handling system supports 410*b* and 408*b*, respectively, rather than to the information handling systems 500.

With the information handling systems 500 coupled to the cable management systems 412 and 414, respectively, on information handling system rack 400 and coupled to the plurality of cables 604*a* and 604*b*, respectively, and with the information handling systems 500 pushed into the information handling system rack 400 for storage and use, a tension is produced in the cables 604*a* and 604*b*. The tension in the cables 604*a* causes the cable management system 412 to pivot into an overpivoted position C and partially out of the information handing system rack 400, as illustrated in FIG. 6*b*. The tension in the cables 604*b* also causes the cable management system 414 to pivot into an overpivoted position D and partially out of the information handing system rack 400, as illustrated in FIG. 6*b*.

Figure 6C:
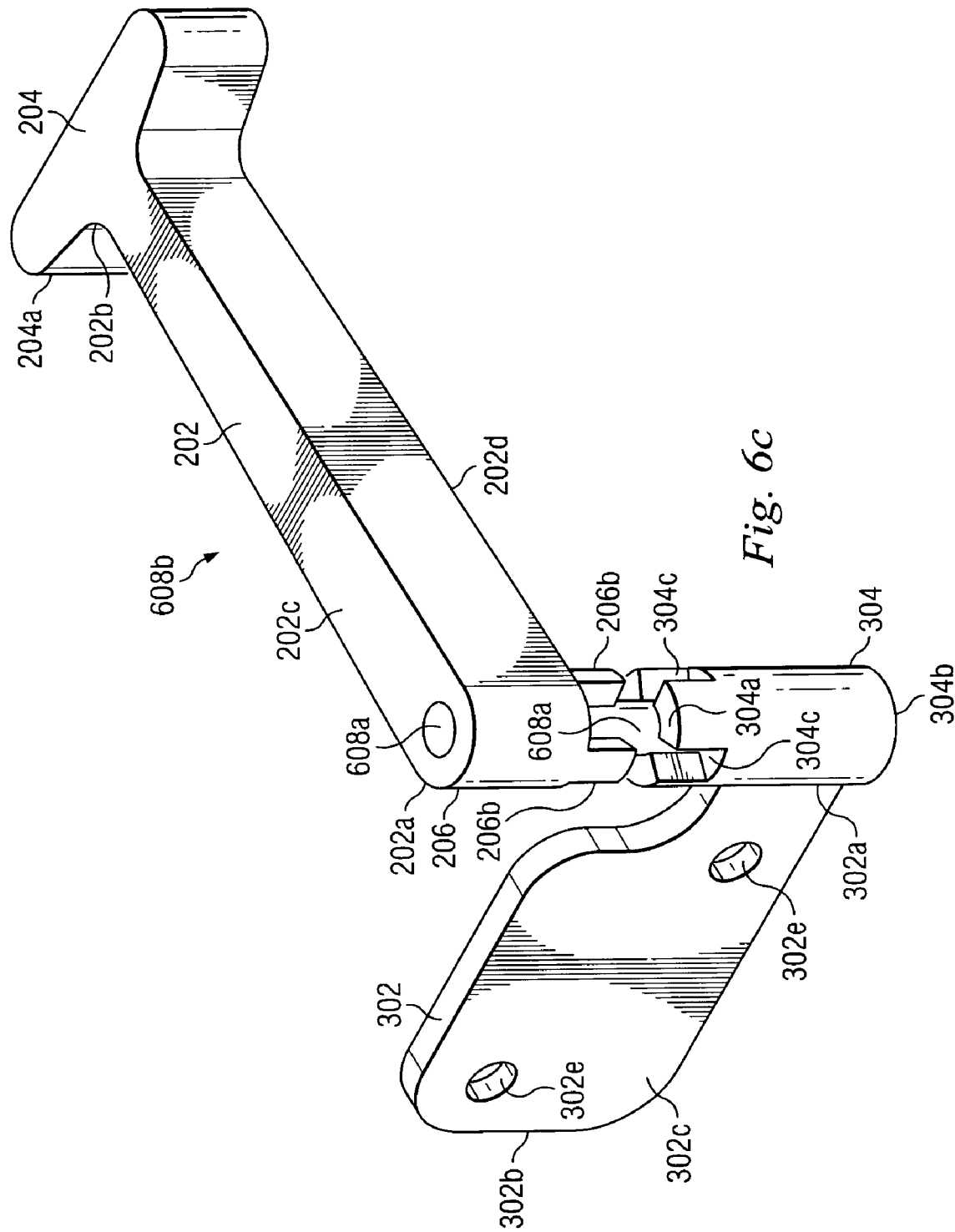
FIG. 6c is a perspective view illustrating an embodiment of the cable management system securing arm of FIG. 2 coupled to the rack mount of FIG. 3.
Figure 6D:
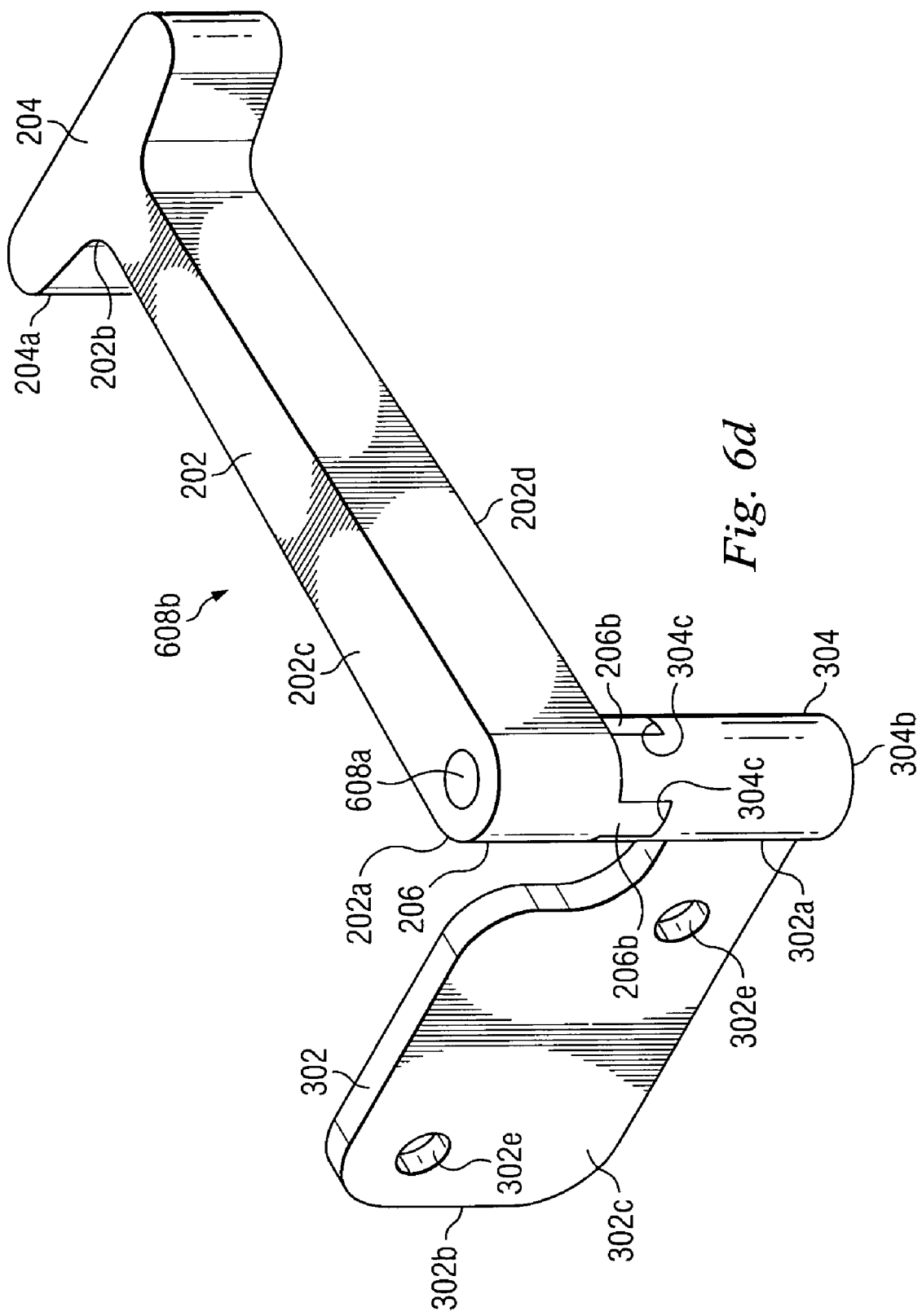
FIG. 6d is a perspective view illustrating an embodiment of the cable management system securing arm and the rack mount of FIG. 6c locked in a securing position.

Referring now to FIGS. 6*a*, 6*c*, 6*d*, and 6*e*, the method 600 then proceeds to step 608 where a cable management securing apparatus is mounted to the information handling system rack 400. The cable management system securing arm 200 is pivotally coupled to the rack mount 300 by placing the cable management system securing arm 200 above the rack mount 300 such that the mount coupler 206 on cable management system securing arm 200 is adjacent the arm coupler 304 on rack mount 300. A coupling pin 608a may then be positioned in the pivotal coupling apertures 206a and 304d on cable management system securing arm 200 and rack mount 300, respectively, as illustrated in FIG. 6c. With the cable management system securing arm 200 pivotally coupled to the rack mount 300, a cable management system securing apparatus 608b is provided. The cable management system securing arm 200 on cable management system securing apparatus 608b may be pivoted about the coupling pin 608a by lifting the cable management system securing arm 200 relative to the rack mount 300, as illustrated in FIG. 6c, and pivoting the cable management system securing arm 200 as desired. The cable management system securing arm 200 on cable management system securing apparatus 608b may be locked into position at various points about its pivoting range of motion by lining up the plurality of securing teeth 206b on the cable management securing arm 200 with the plurality of securing channels 304c on the rack mount 300 and positioning the plurality of securing teeth 206b in the plurality of securing channels 304c, as illustrated in FIG. 6d. The cable management system securing apparatus 608b may then be unlocked by lifting the cable management system securing arm 200 relative to the rack mount 300 to disengage the securing teeth 206b from the securing channels 304c and pivoting the cable management system securing arm 200 as desired. In an embodiment, the cable management system securing arm 200 and the rack mount 300 may include a variety of different designs which allow the cable management securing arm 200 to be rotated and locked into position about its pivoting range of motion.

Figure 6E:
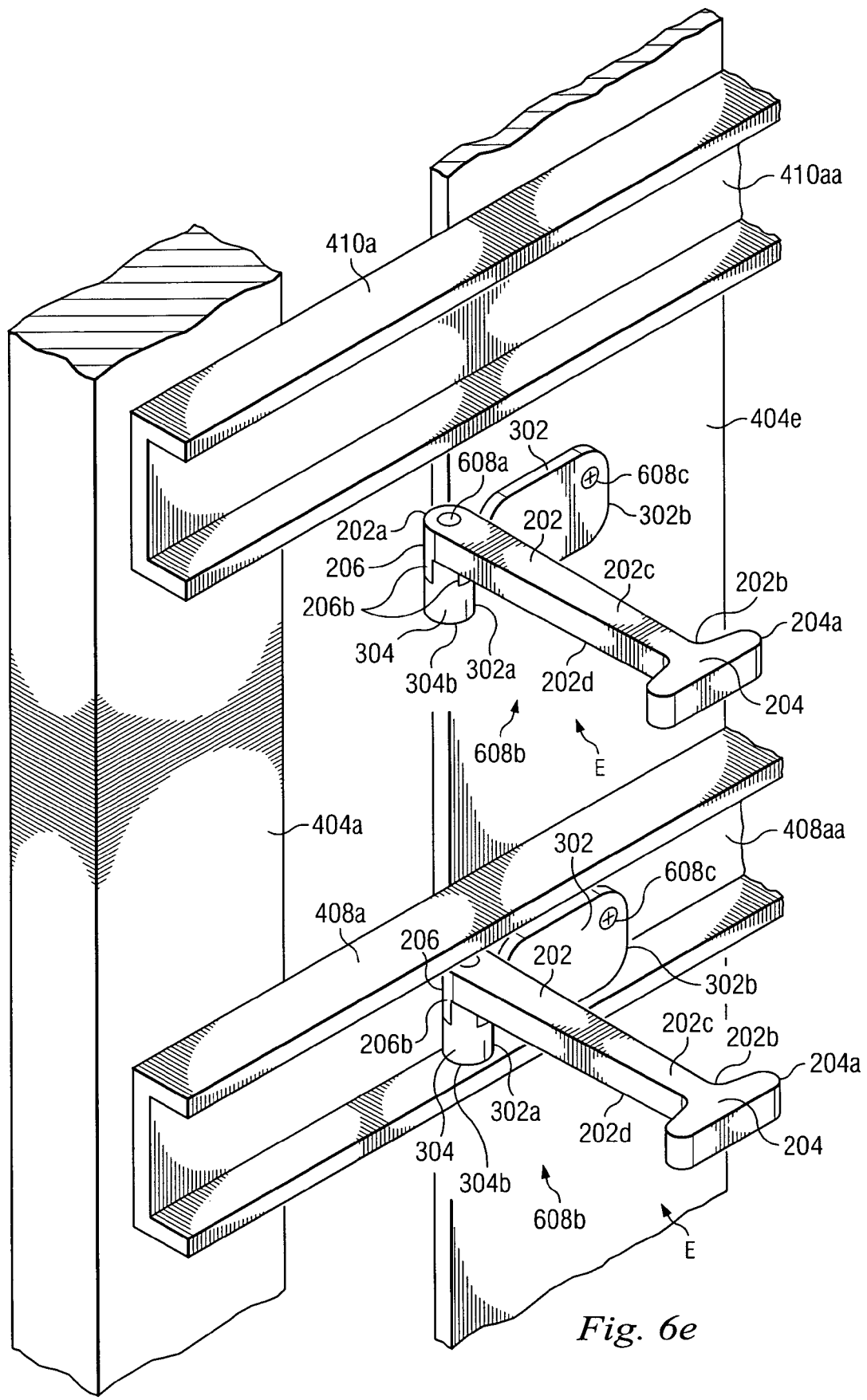
FIG. 6e is a perspective view illustrating an embodiment of the cable management system securing arm and the rack mount of FIG. 6c mounted in the information handling system rack of FIG. 4.

A cable management system securing apparatus 608b is then mounted to the information handling system rack 400 by positioning it between the information handling system supports 408a and 410a and adjacent the coupling beam 404e. The rack mount 300 on cable management system securing apparatus 608b is then mounted to the coupling beam 404e using conventional methods known in the art such as, for example, coupling a plurality of threaded fasteners 608c to the coupling beam 404e through the mounting apertures 302e on rack mount 300, as illustrated in FIG. 6e. A cable management system securing apparatus 608b is also mounted to the information handling system rack 400 by positioning it adjacent the information handling system support 408a. The rack mount 300 on cable management system securing apparatus 608b is then mounted in the coupling channel 408aa of information handling system support 408a using conventional methods known in the art such as, for example, coupling a plurality of threaded fasteners 608c to the information handling system support 408a through the mounting apertures 302e on rack mount 300, as illustrated in FIG. 6e. In an embodiment, the rack mount 300 may include a variety of different designs which allow it to be mounted to the information handling system rack 400. In an embodiment, the cable management securing apparatus 608b may be mounted to a variety of different locations on the information handling system rack 400 such as, for example, to a distal end of the information handling system support 408a. The plurality of cable management system securing apparatus 608b may then be pivoted and locked into a securing position E in which the cable management system securing arms 200 extend substantially perpendicularly from the coupling beam 404e and the information handling system support 408a, respectively, as illustrated in FIG. 6e. In an embodiment, the coupling pin 608a may include a biasing member such as, for example, a spring, which biases the cable management securing arm 200 into the securing position E.

Figure 6F:
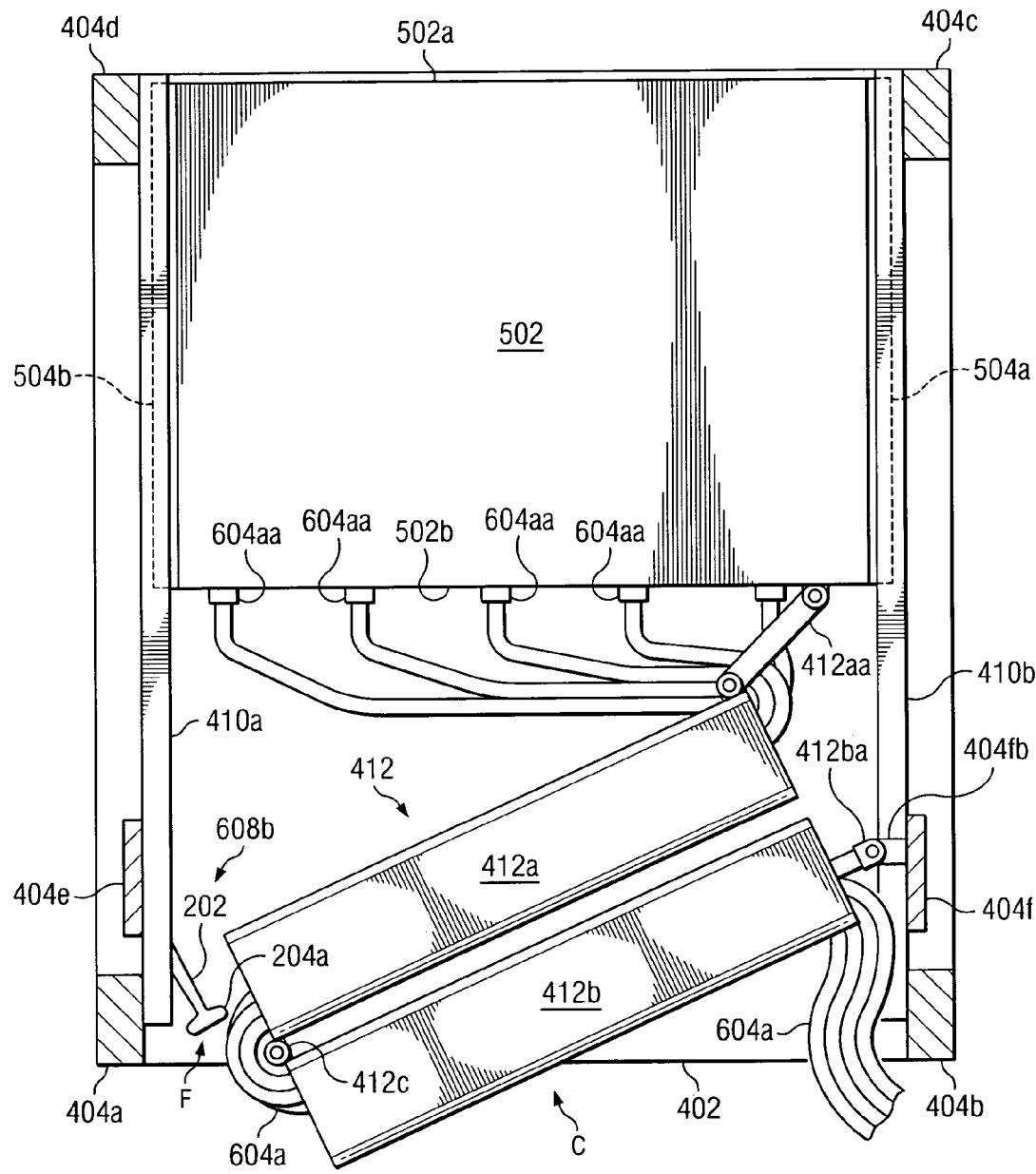
FIG. 6f is a cross sectional view illustrating an embodiment of the cable management system securing arm, the rack mount, the information handling system rack, the information handling system, and the plurality of cables of FIGS. 6b and 6e with a cable management system in an overpivoted position.
Figure 6G:
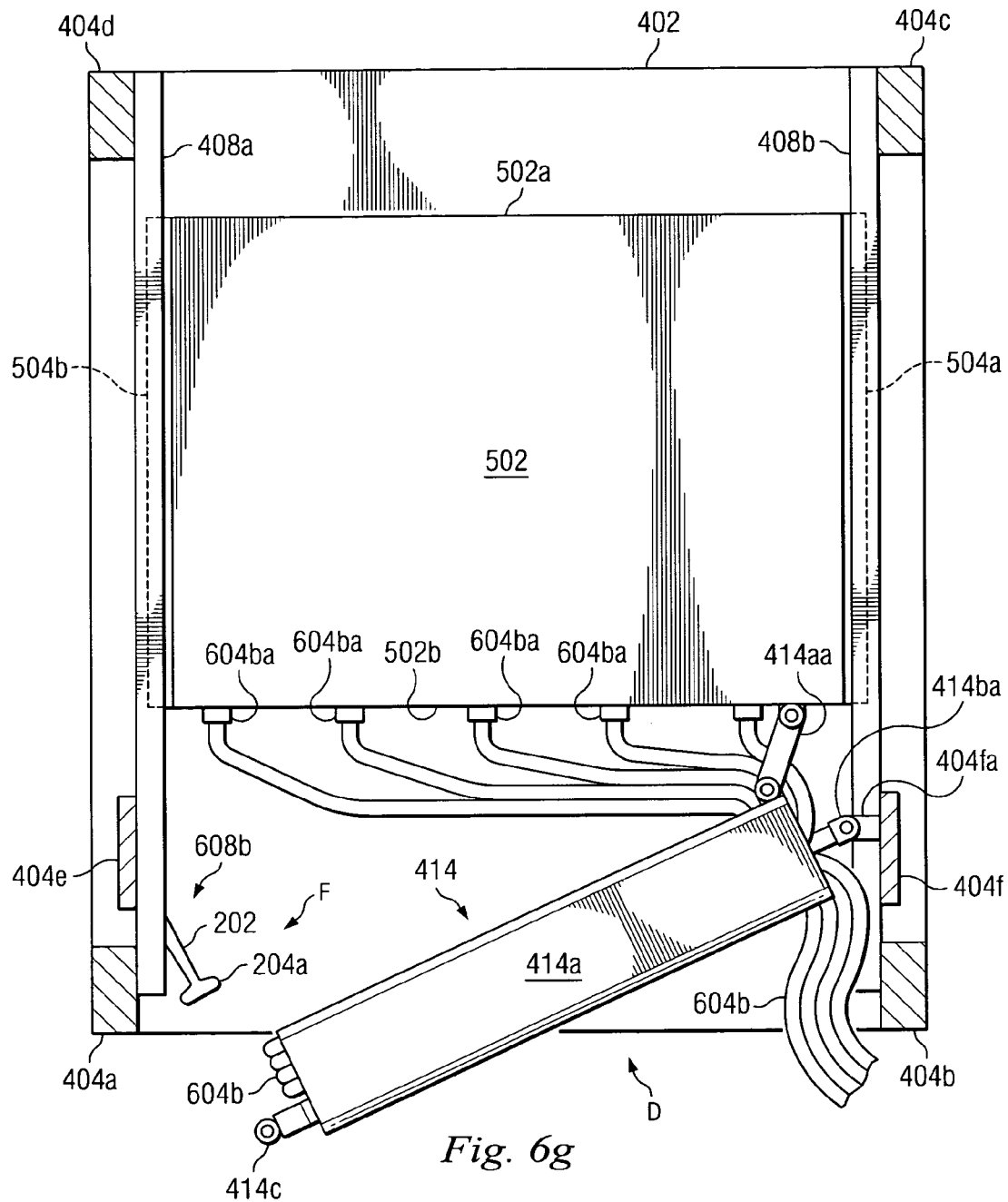
FIG. 6g is a cross sectional view illustrating an embodiment of the cable management system securing arm, the rack mount, the information handling system rack, the information handling system, and the plurality of cables of FIGS. 6b and 6e with a cable management system in an overpivoted position.

Referring now to FIGS. 6f and 6g, when the cable management system securing apparatus 608b is positioned in a release position F, illustrated in FIG. 6f, the tension in the cables 604a causes the cable management system 412 to pivot past the cable management system securing apparatus 608b and into the overpivoted position C and partially out of the information handing system rack 400, as illustrated in FIGS. 6b and 6f. When the cable management system securing apparatus 608b is positioned in a release position F, illustrated in FIG. 6g, the tension in the cables 604b causes the cable management system 414 to pivot past the cable management system securing apparatus 608b and into the overpivoted position D and partially out of the information handing system rack 400, as illustrated in FIGS. 6b and 6g.

Figure 6H:
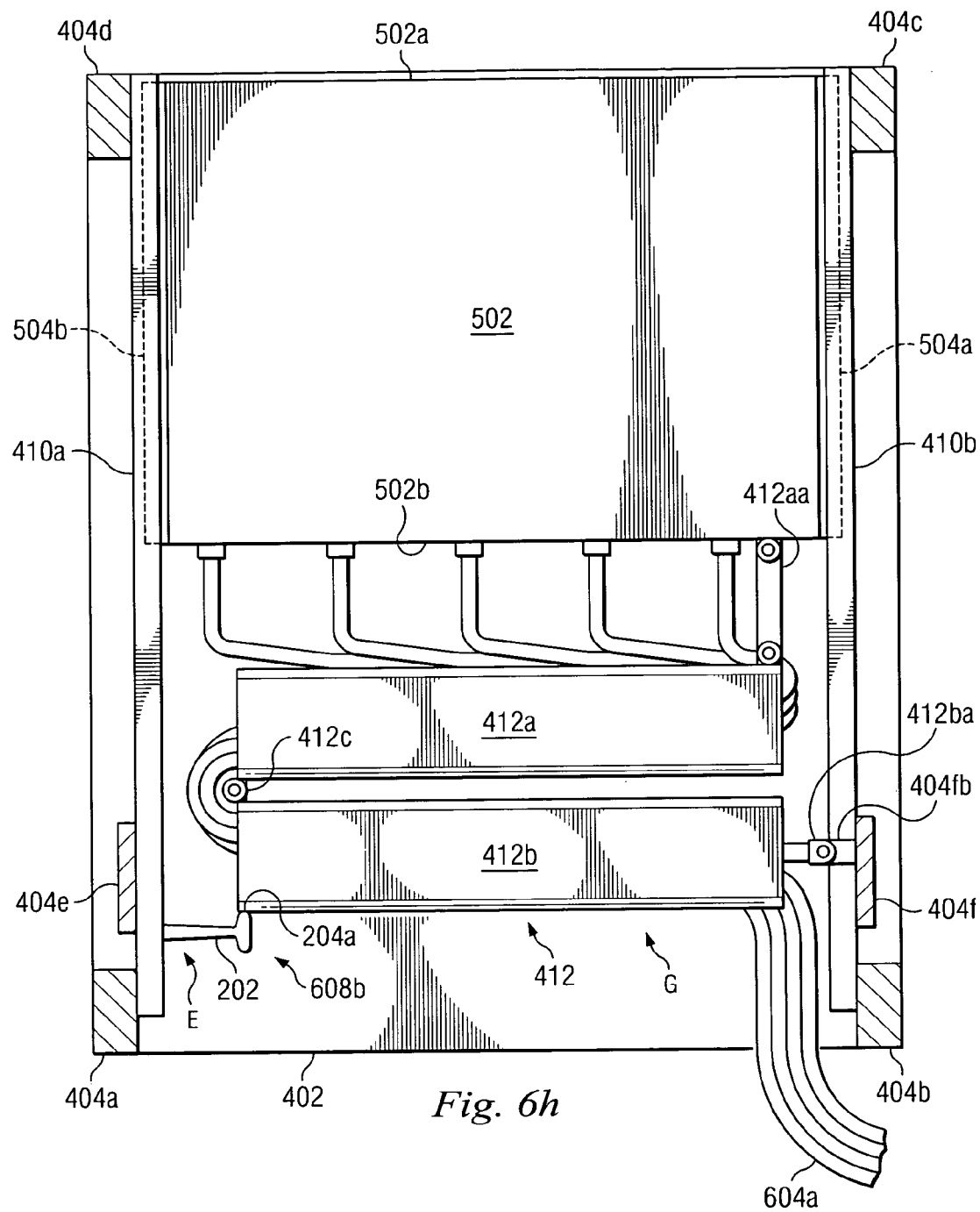
FIG. 6h is a cross sectional view illustrating an embodiment of the cable management system securing arm, the rack mount, the information handling system rack, the information handling system, and the plurality of cables of FIG. 6f with a cable management system secured in storage position.
Figure 6I:
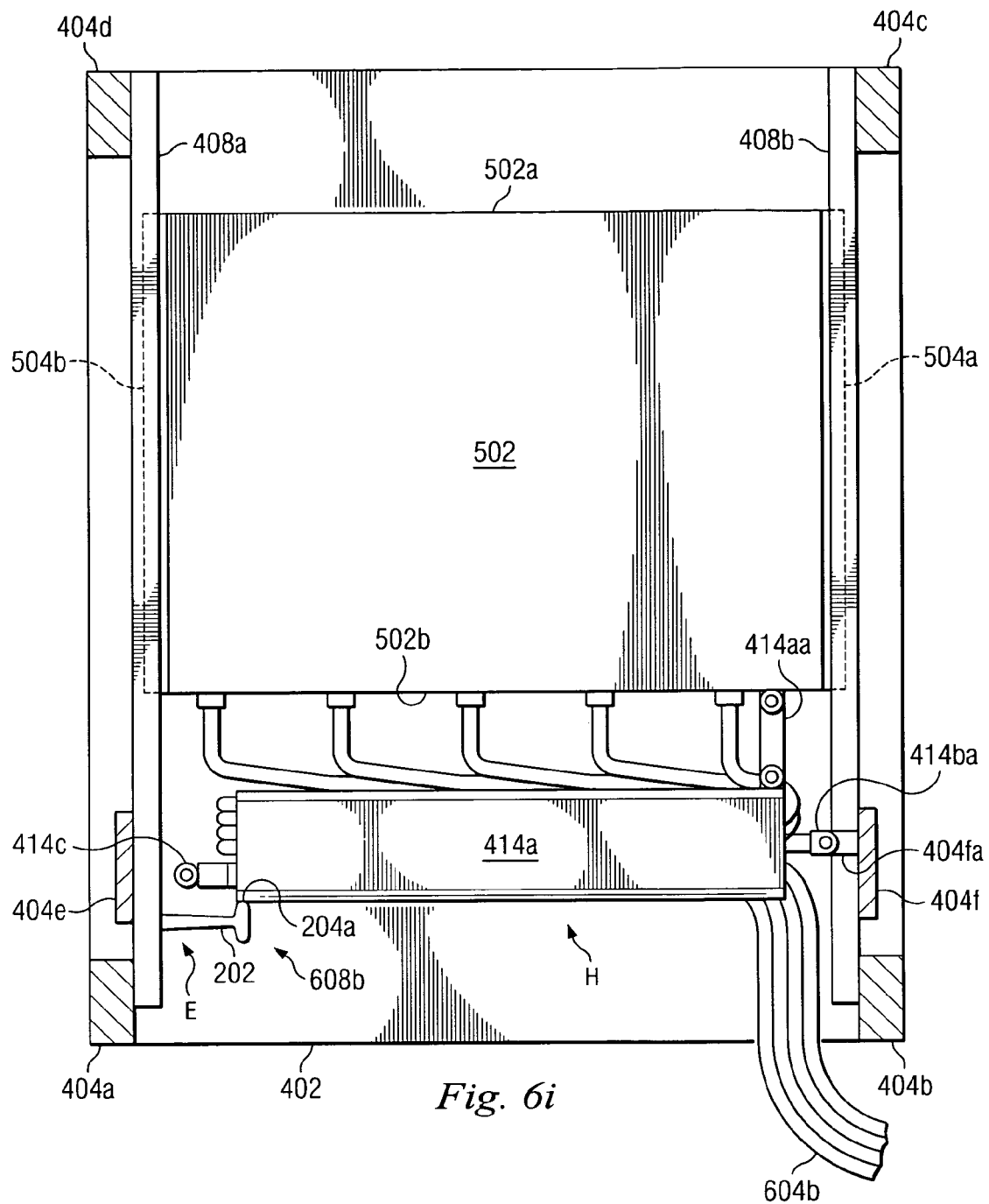
FIG. 6i is a cross sectional view illustrating an embodiment of the cable management system securing arm, the rack mount, the information handling system rack, the information handling system, and the plurality of cables of FIG. 6g with a cable management system secured in storage position.

Referring now to FIGS. 6a, 6f, 6g, 6h, and 6i, the method 600 then proceeds to step 610 where the cable management system is secured in the information handling system rack 400 using the cable management system securing apparatus 608b. The cable management system 412 is pivoted from the overpivoted position C, illustrated in FIG. 6f, to a storage position G such that the cable management member 412b extends substantially perpendicularly from the coupling beam 404f, as illustrated in FIG. 6h. The cable management system securing apparatus 608b is then pivoted and locked in the securing position E in the manner described above with respect to FIGS. 6c, 6d, and 6e, which results in the system engagement surface 204a on cable management system securing arm 200 engaging cable management member 412b on cable management system 412 and secures the cable management system 412 in the storage position G. The cable management system 412 may be released to the overpivoted position C by unlocking and pivoting the cable management system securing apparatus 608b as described above. The cable management system 414 is also pivoted from the overpivoted position D, illustrated in FIG. 6g, to a storage position H such that the cable management member 414a is oriented substantially perpendicularly to the coupling beam 404f, as illustrated in FIG. 6i. The cable management system securing apparatus 608b is then pivoted and locked in the securing position E in the manner described above with respect to FIGS. 6c, 6d, and 6e, which results in the system engagement surface 204a on cable management system securing arm 200 engaging cable management member 414a on cable management system 414 and secures the cable management system 414 in the storage position H. The cable management system 414 may be released to the overpivoted position D by unlocking and pivoting the cable management system securing apparatus 608b as described above. In an embodiment, the cable management system securing apparatus 608b may be used to hold the cable management systems 412 and 414 in the storage positions G and H, respectively, when the plurality of cables 604a and 604b do not create a tension sufficient to pivot the cable management systems 412 and 414 to the over pivoted positions C and D, respectively. Thus, a method and apparatus are provided which allow a cable management system to be secured in an information handling system rack 400 and which are easy to install and use in a variety of different positions on the information handling system rack 400 while taking up minimal space in the information handling system rack 400.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A cable management system securing apparatus, comprising:
   a rack;
   a cable management system pivotally connected to a first side of the rack;
   a rack mount mounted to a second side of the rack that is opposite the rack from the first side; and
   a cable management system securing arm pivotally coupled to the rack mount and operable to be pivoted and locked in each of a securing position and a release position, wherein in the securing position, the cable management system securing arm engages the cable management system in order to prevent pivoting of the cable management system relative to the rack in at least one direction, and wherein in the release position, the cable management system is allowed to pivot to an overpivoted position.

2. The apparatus of claim 1 wherein the rack mount defines a plurality of mounting apertures.

3. The apparatus of claim 1, wherein the rack mount includes an arm coupler defining a plurality of arm securing channels.

4. The apparatus of claim 3, wherein the cable management system securing arm includes a distal end having a mount coupler including a plurality of securing teeth extending from the mount coupler, whereby the mount coupler is pivotally coupled to the arm coupler and the cable management system securing arm is operable to be pivoted and locked in the securing position and the release position by positioning the securing teeth in the arm securing channels.

5. The apparatus of claim 1, further comprising:
   a plurality of cables coupled to the cable management system.

6. The apparatus of claim 5, wherein the plurality of cables result in the cable management system pivoting from a storage position to an overpivoted position.

7. The apparatus of claim 6, wherein the cable management system is prevented from pivoting to the overpivoted position when the cable management system securing arm is in the securing position and engaging the cable management system.

8. A cable management system securing apparatus, comprising:
   an information handling system rack;
   a cable management system comprising a first cable management member that is pivotally connected to the information handling system rack and a second cable management member that is pivotally connected to the first cable management member;
   a rack mount mounted to the information handling system rack opposite the information handling system rack from the pivotal connection of the first cable management member and the information handling system rack; and
   a cable management system securing arm pivotally coupled to the rack mount and operable to be pivoted and locked in each of a securing position and a release position, wherein in the securing position, the cable management system securing arm engages the cable management system in order to prevent pivoting of the cable management system relative to the information handling system rack in at least one direction, and wherein in the release position, the cable management system is allowed to pivot to an overpivoted position.

9. The apparatus of claim 8 wherein the rack mount defines a plurality of mounting apertures.

10. The apparatus of claim 8, wherein the rack mount includes an arm coupler defining a plurality of arm securing channels.

11. The apparatus of claim 10, wherein the cable management system securing arm includes a distal end having a mount coupler including a plurality of securing teeth extending from the mount coupler, whereby the mount coupler is pivotally coupled to the arm coupler and the cable management system securing arm is operable to be pivoted and locked in the securing position and the release position by positioning the securing teeth in the arm securing channels.

12. The apparatus of claim 8, wherein the cable management system is pivotable from a storage position to an overpivoted position.

13. The apparatus of claim 12, wherein the cable management system is prevented from pivoting to the overpivoted position when the cable management system securing arm is in the securing position and engaging the cable management system.

14. The apparatus of claim 12, further comprising:
   a plurality of cables coupled to the first cable management member and the second cable management member on the cable management system.

15. The apparatus of claim 14, further comprising:
   an information handling system coupled to the information handling system rack with the plurality of cables coupled to the information handling system.

16. A method for securing a cable management system, comprising:
   providing an information handling system rack including a cable management system pivotally connected to a first side of the information handling system rack, whereby the cable management system is pivotable from a storage position to an overpivoted position; and
   mounting a cable management system securing apparatus to a second side of the information handling system rack that is opposite the information handling system rack from the first side, the cable management system securing apparatus including a rack mount mounted to the second side of the information handling system rack and a cable management system securing arm that is pivotally coupled to the rack mount and operable to be pivoted into a securing position and a release position, wherein in the securing position, the cable management securing arm engages the cable management system in order to hold the cable management system in the storage position and prevent pivoting of the cable management system relative to the information handling system rack in at least one direction, and wherein in the release position, the cable management system is allowed to pivot to the overpivoted position.

17. The method of claim 16, further comprising:
   coupling a plurality of cables to the cable management system.

18. The method of claim 17, further comprising:
   coupling an information handling system to the information handling system rack;
   coupling the plurality of cables to the information handling system; and
   securing the cable management system in the information handling system rack in order to prevent the cable management system from pivoting into the overpivoted position by pivoting and locking the cable management system securing arm in the securing position such that the cable management system securing arm engages the cable management system.

19. A cable management system securing apparatus, comprising:

an information handling system rack;

a rack mount mounted to the information handling system rack;

a cable management system securing arm moveably connected to the rack mount and operable to be secured in each of a securing position and a release position; and a cable management system coupled to the information handling system rack, the cable management system comprises a first cable management member that is pivotally connected to the information handling system rack, a second cable management member that is pivotally connected to the first cable management member, and an information handling system that is pivotally connected to the second cable management member and that is located in the information handling system rack, wherein the cable management system is operable to move between an overpivoted and a storage position when the cable management system securing arm is in the release position, and wherein the cable management system is prevented from moving between the storage position and the overpivoted position when the cable management system securing arm is in the securing position.

20. The apparatus of claim 19, wherein the rack mount defines a plurality of mounting apertures.

21. The apparatus of claim 19, wherein the cable management system securing arm is operable to be secured in a release position.

22. The apparatus of claim 19, wherein the cable management system is operable to move between an overpivoted and a storage position.

23. The apparatus of claim 19, further comprising:

a plurality of cables coupled to the cable management system.

24. The apparatus of claim 23, wherein the plurality of cables are coupled to the information handling system.

* * * * *